United States Patent
Tan

(10) Patent No.: US 8,300,404 B2
(45) Date of Patent: Oct. 30, 2012

(54) FAN HOLDER INCLUDING CABLE CHANNELS

(75) Inventor: Choon Pheng Tan, Singapore (SG)

(73) Assignee: Hewlett-Packard Development Company, L.P., Houston, TX (US)

( * ) Notice: Subject to any disclaimer, the term of this patent is extended or adjusted under 35 U.S.C. 154(b) by 235 days.

(21) Appl. No.: 12/760,825

(22) Filed: Apr. 15, 2010

(65) Prior Publication Data

US 2011/0255238 A1    Oct. 20, 2011

(51) Int. Cl.
*H05K 7/20* (2006.01)
*F16L 3/22* (2006.01)
*F04B 17/00* (2006.01)

(52) U.S. Cl. ............... 361/679.48; 361/695; 361/826; 248/68.1; 417/360

(58) Field of Classification Search ............ 361/679.01, 361/679.46–679.49, 695, 826; 415/206; 312/236; 174/60, 64, 72 A; 417/360
See application file for complete search history.

(56) References Cited

U.S. PATENT DOCUMENTS

| | | | |
|---|---|---|---|
| 6,170,784 B1 | 1/2001 | MacDonald et al. | |
| 6,288,897 B1 | 9/2001 | Fritschle et al. | |
| 6,347,714 B1 | 2/2002 | Fournier et al. | |
| 6,438,309 B1 | 8/2002 | Franz | |
| 6,590,785 B1 | 7/2003 | Lima et al. | |
| 6,600,665 B2 | 7/2003 | Lauchner | |
| 6,603,661 B2* | 8/2003 | Smith et al. | 361/695 |
| 6,686,541 B2 | 2/2004 | Chan | |
| 6,809,258 B1 | 10/2004 | Dang et al. | |
| 7,119,280 B1 | 10/2006 | Ray et al. | |
| 7,171,098 B2 | 1/2007 | Weinegger | |
| 7,259,962 B2* | 8/2007 | Chen | 361/695 |
| 7,562,779 B2 | 7/2009 | Bravo et al. | |
| 7,822,323 B2* | 10/2010 | Sugiyama et al. | 392/410 |
| 7,983,039 B1* | 7/2011 | Nguyen et al. | 361/695 |
| 8,068,340 B1* | 11/2011 | Nguyen et al. | 361/695 |
| 8,075,248 B2* | 12/2011 | Yin et al. | 415/60 |
| 2002/0054479 A1* | 5/2002 | Wu | 361/695 |
| 2008/0130261 A1 | 6/2008 | Dennes | |
| 2008/0152489 A1* | 6/2008 | Alex et al. | 415/213.1 |
| 2008/0212274 A1* | 9/2008 | Song et al. | 361/686 |
| 2009/0021912 A1* | 1/2009 | Yin | 361/695 |
| 2009/0195978 A1* | 8/2009 | Hu et al. | 361/679.48 |

* cited by examiner

*Primary Examiner* — Zachary M Pape

(57) ABSTRACT

A fan holder includes a casing structure having a first side and a second side. The casing structure includes a base, fan compartments extending from the base, and cable channels extending from the first side to the second side within the base. Each of the cable channels is configured to removably secure at least one of a plurality of cables.

20 Claims, 5 Drawing Sheets

FAN HOLDER INCLUDING CABLE CHANNELS

BACKGROUND

Server computer systems, such as compact rack servers, typically include cables which are routed from front sub-boards (e.g., bezel sub-boards) to main system board. Compact 2U rack servers, for example, often have a row of fans disposed between the front bezel sub-boards and the main system board which obstructs the routing of the cables.

A prior solution for routing cables from the front bezel sub-boards to a connector on the main system board includes squeezing cables through a side wall of a fan holder and a wall of a chassis. This traditional solution uses a thin space, often only a 5 mm gap, between the fan holder side wall and the chassis wall to run the cables through. However, not all cables can be routed in this manner to the connectors on the main system board, as there are typically other large components obstructing the cables' route.

Traditional routing solutions have limited the placement locations of components on the main system board, resulted in longer cables and aggravated servicing of compact rack servers. Other potential solutions, such as relocating the main system board cable connectors, are constrained by other compact rack server features, such as system partitioning and component signal trace length integrity. It is desirable that the cable routing be simple and easy for rack server manufacturing assembly, as well as for rack server repair or servicing.

For these and other reasons, a need exists for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
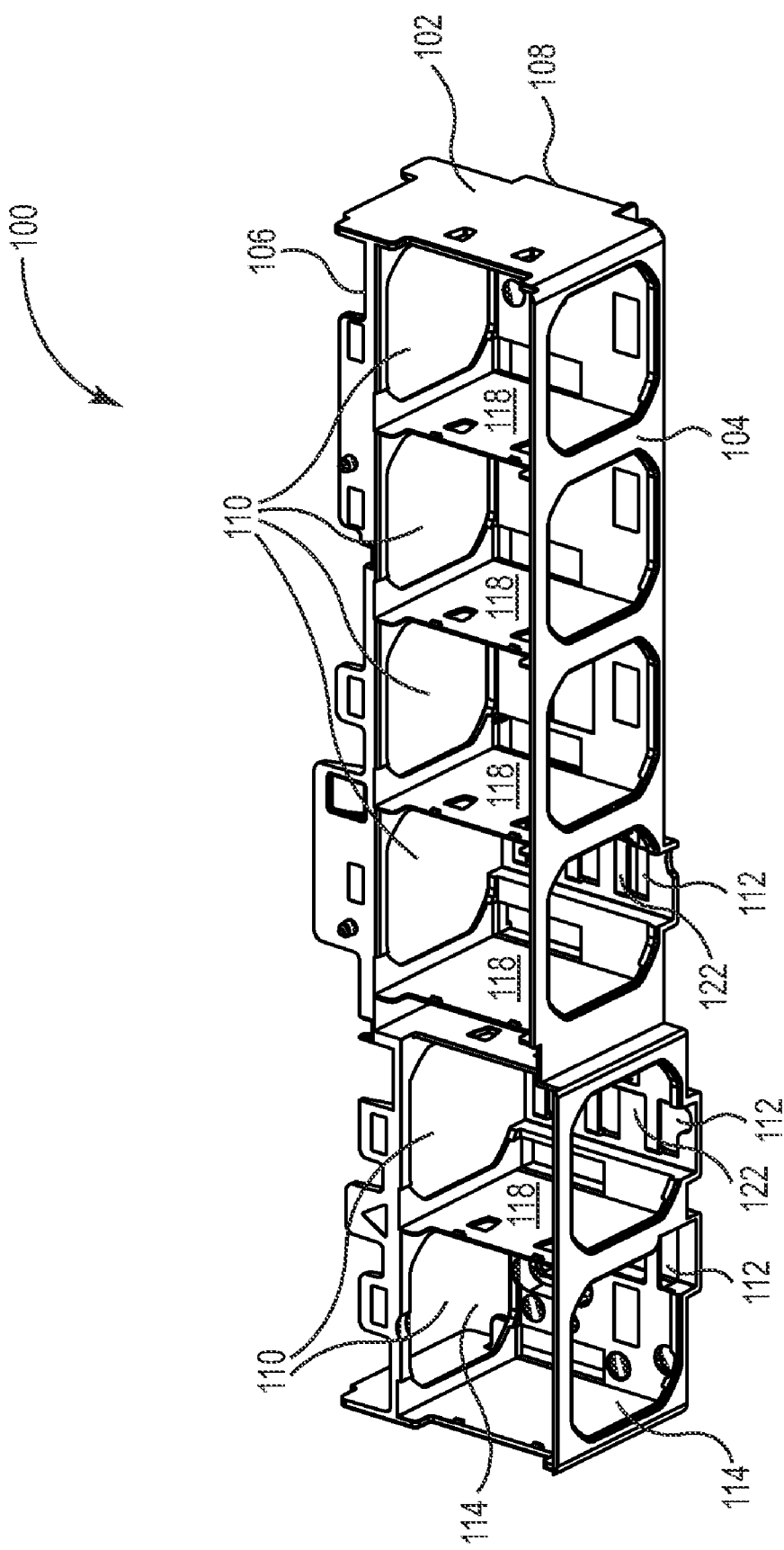
FIG. 1 is a perspective view of a fan holder according to one embodiment.

FIG. 1 illustrates one embodiment of a fan holder 100 that includes a casing structure 102 having a first side 104 and a second side 106. Casing structure 102 includes a base 108, fan compartments 110, and cable channels 112. Fan compartments 110 extend from base 108. Cable channels 112 extend from first side 104 to second side 106 within base 108. Each of cable channels 112 is configured to removably secure at least one of cables 120 (illustrated in FIG. 2). In one embodiment, fan holder 100 includes cable channels 112 configured to removably secure cables 120 in a computer system, such as a rack server.

Figure 2:
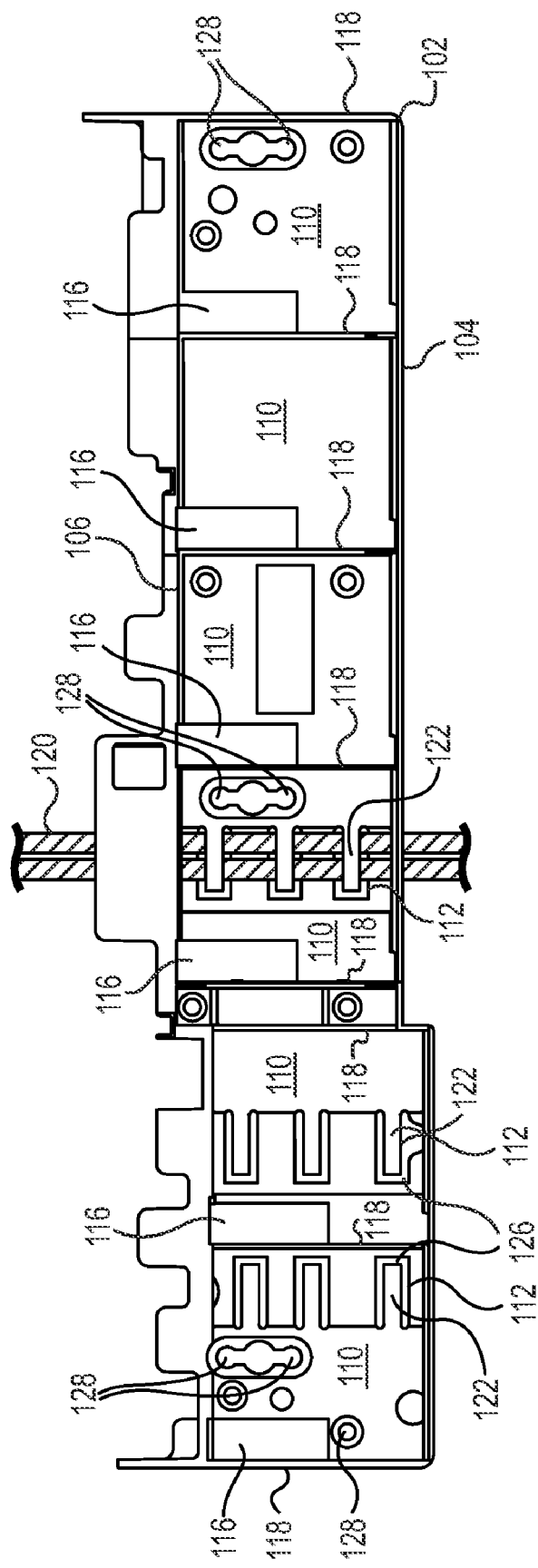
FIG. 2 is a top view of the fan holder according to one embodiment.
Figure 3:
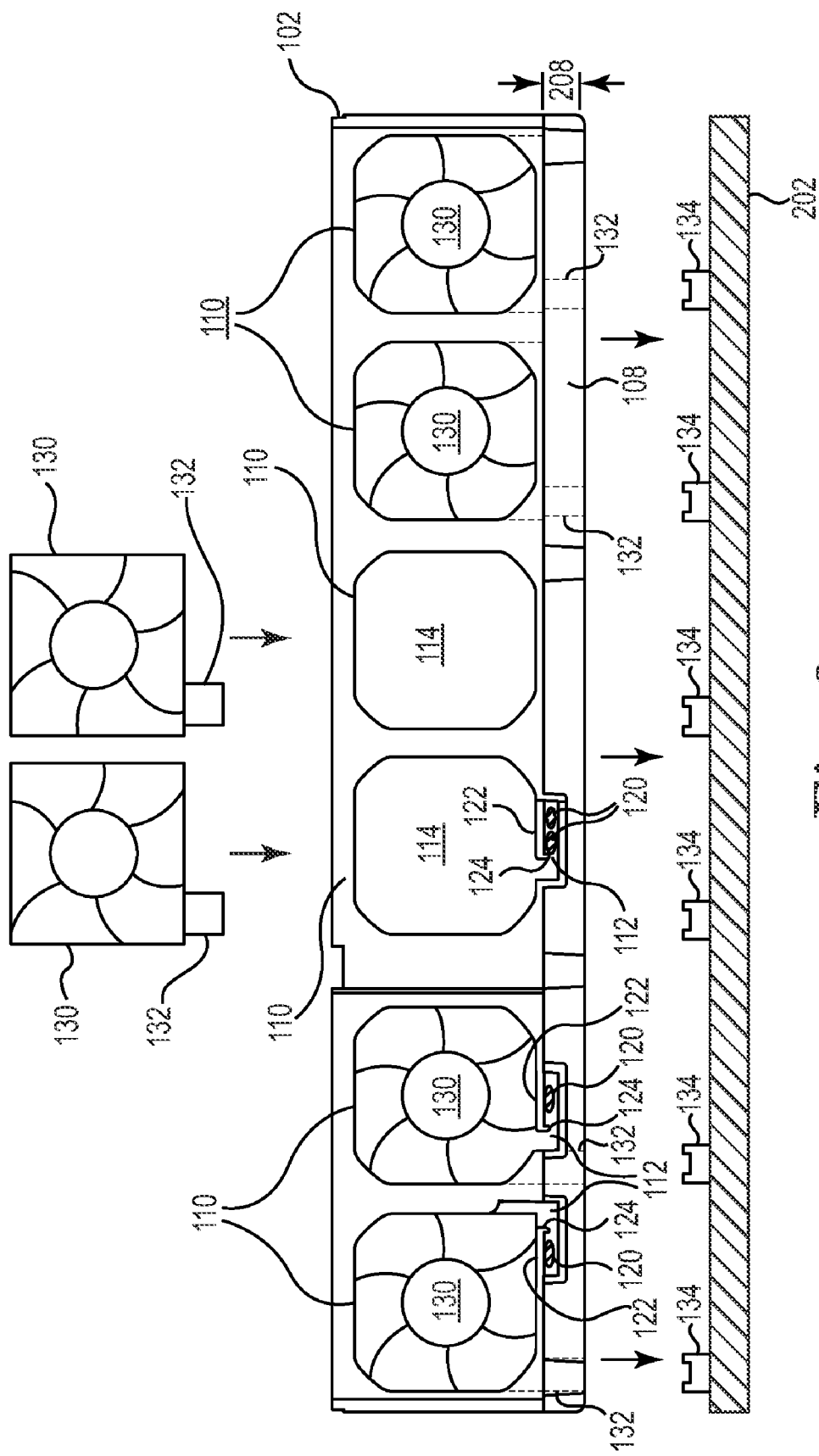
FIG. 3 is a side view of the fan holder according to one embodiment.

With reference to FIGS. 1 through 3, in one embodiment, casing structure 102 is generally rectangular. In one embodiment, first side 104 and second side 106 are parallel opposing sides of casing structure 102. In one embodiment, first side 104 and second side 106 are perpendicular to base 108. First side 104 and second side 106 include airflow openings 114 which permit airflow through fan compartments 110 when fans 130 (illustrated in FIG. 3) are installed. In one embodiment, casing structure 102 is formed monolithically. In one embodiment, casing structure 102 is formed of plastic resin, although casing structure 102 can be formed of other suitable materials.

Fan compartments 110 extend from first side 104 to second side 106. In one example embodiment, fan compartment 110 includes six fan compartments 110. In one embodiment, fan compartments 110 are aligned such that each fan compartment extends equally between first side 104 and second side 106. In one embodiment, fan compartments 110 are aligned in a series along base 108. In one embodiment, fan compartments 110 are aligned both vertically and horizontally. In another embodiment, fan compartments 110 are juxtaposed. In one embodiment, wall 118 extends between each of fan compartments 110 from first side 104 to second side 106, effectively dividing fan holder 100 into distinct and separate fan compartments 110. In addition to dividing fan holder 100 into fan compartments 110, walls 118 provide stability and secure fans 130. Walls 118 also increase the overall structural integrity of fan holder 100.

In one embodiment, walls 118 are a solid plane, however penetrations may be included. In one embodiment, walls 118 include penetration to allow fans 130 to clip into compartments 110. Fan compartments 110 are each sized to accommodate fans 130, which are, in one example embodiment, 60×60×60 mm.

As illustrated in FIG. 3, base 108 is adjoined with fan compartments 110. Base 108 and fan compartments 110 are selectively open to each other within fan holder 100. As illustrated in FIG. 2, base 108 includes an attachment mechanism 128 to securely mount fan holder 100 within a computer system such as a rack server. Embodiments of attachment mechanism 128 include screws, adhesives, or other suitable attachment mechanisms. Each fan compartment 110 includes fan connector opening 116 in base 108. In one embodiment, base 108 includes a stepped structure which extends to a greater height at in areas which cables 120 are to be installed than elsewhere along base 108. In one embodiment, base 108 includes varied elevations with extensions which act as supports.

In referring to FIGS. 1-3, base 108 includes cable channels 112 extending through from first side 104 to second side 106. In one embodiment, cable channels 112 provide space for cables 120 to route through fan holder 100. In one embodiment, cable channels 112 include cantilevered arms 122. In one embodiment illustrated in FIG. 2, cantilevered arms 122 are rigidly flexible and configured to removably retain cables 120 in a generally fixed position within fan holder 100 after cables 120 are inserted in fan holder 100. In one embodiment, cantilevered arms 122 extend to terminate at a free hooked end 124. In one embodiment, as illustrated in FIG. 2, cantilevered arms 122 extend over opposing open spaces 126 along an exterior side of base 108 to allow cables 120 space to flex while being inserted. Alternatively, base 108 may be open along a length of cable channel 112, opposite cantilevered arms 122. In one embodiment, each cable 120 is routed individually under an individual compartment 110 in base 108 for manufacturing processes and serviceability of a rack server which includes fan holder 100. In one embodiment, cable channels 112 reduces or minimizes employment of cable retention clips in the server 200, thereby saving space for other components.

In one example embodiment, cables 120 include two SAS (Serial Attached SCSI) signal cables, a SAS (Serial Attached SCSI) power cable, a DVD (Digital Versatile Disc) drive cable and a SID (System Insight Display) cable. In one example embodiment, fan holder 100 is employed in a rack server that includes three cables 120 which extend across fans 130 and three of fan compartments 110 include a corresponding adjoining cable channel 112. Cables 120 typically have degrees of flexibility, and in one embodiment, a relative stiffness of cables 120 reduces the degree of bending in the cables. In one example embodiment, a suitable cable 120 has a width of approximately 12 mm.

With reference to FIG. 3, each of fans 130 securely resides within a corresponding fan compartment 110 while cables 120 extend within base 108. Fan holder 100 enables a cable 120 to route within base 108 underneath fan compartments 110 of fan holder 100 while not affecting the stability and performance of the fans 130.

In an example embodiment of a 2U rack server having fan holder 100, a common size of fan 130 is 60×60×60 mm is used, although other sizes are also acceptable. In one embodiment, fans 130 are hot swap fans. In order to ensure stability and rigidly of each fan 130 in a compact rack server, for example, molded plastic fan holder 100 is configured to hold fans 130 assembled together, separated by each compartment wall 118. Thus, fans 130 are assembled very close to each other in an example compact rack server with only minimal space between adjacent fans 130.

In the computer system 200, base 108 of fan holder 100 incorporates a vertical space 208 below the row of fans 130 (vertically illustrated in FIG. 3) which would otherwise be above the row of fans 130. In one example embodiment where computer system 200 is a 2U compact rack server, the vertical space 208 is, for example, approximately 10 mm. By taking advantage of vertical space 208, typically located between the row of fans 130 and a top cover of computer system 200, the row of fans 130 can be raised higher in order to allow cables 120 to channel through fan holder 100 in cable channels 112.

As illustrated in FIG. 3, fans 130 are usually assembled in a vertical top-down direction. Each fan 130 has its own connector 132 (e.g., male connector) to mate with a system board fan connector 134 (e.g. female connector). In one embodiment, a fan connector 132 (e.g., male connector) of fans 130 and system board fan connector 134 (e.g., female connector) on main system board 202 are further apart then typically constructed. Thus, fan connector 132 (e.g., male connector) of fans 130 can be extended on each of fans 130 which will be installed over a cable channel 112 in order to be mateable with its corresponding system board fan connector 134 (e.g., female connector) on main system board 202.

Cable 120 is assembled into cable channels 112 of fan holder 100 by sliding into and between cantilevered arms 122 of base 108. Cables 120 are removably secured in a neat and orderly manner. Cantilevered arms 122 function as retention clips to removably secure cables 120 and thus reduce or eliminate additional parts (e.g., separate retention clips) configured to retain cables 120. By assembling cables 120 into cable channels 112 permits visual access to cables 120 when connecting cables 120 in a computer system. After a cable 120 is routed through fan holder 100, each fan 130 can be installed into a corresponding one of fan compartments 110 in top-down manner. As assembled, the hot swap capability of fans 130 is maintained. In order to remove a cable 120, access to the cable 120 is provided by removing a fan 130 positioned in a corresponding fan compartment 110 directly adjoining base 108 with the respective cable channel 112.

Figure 4:
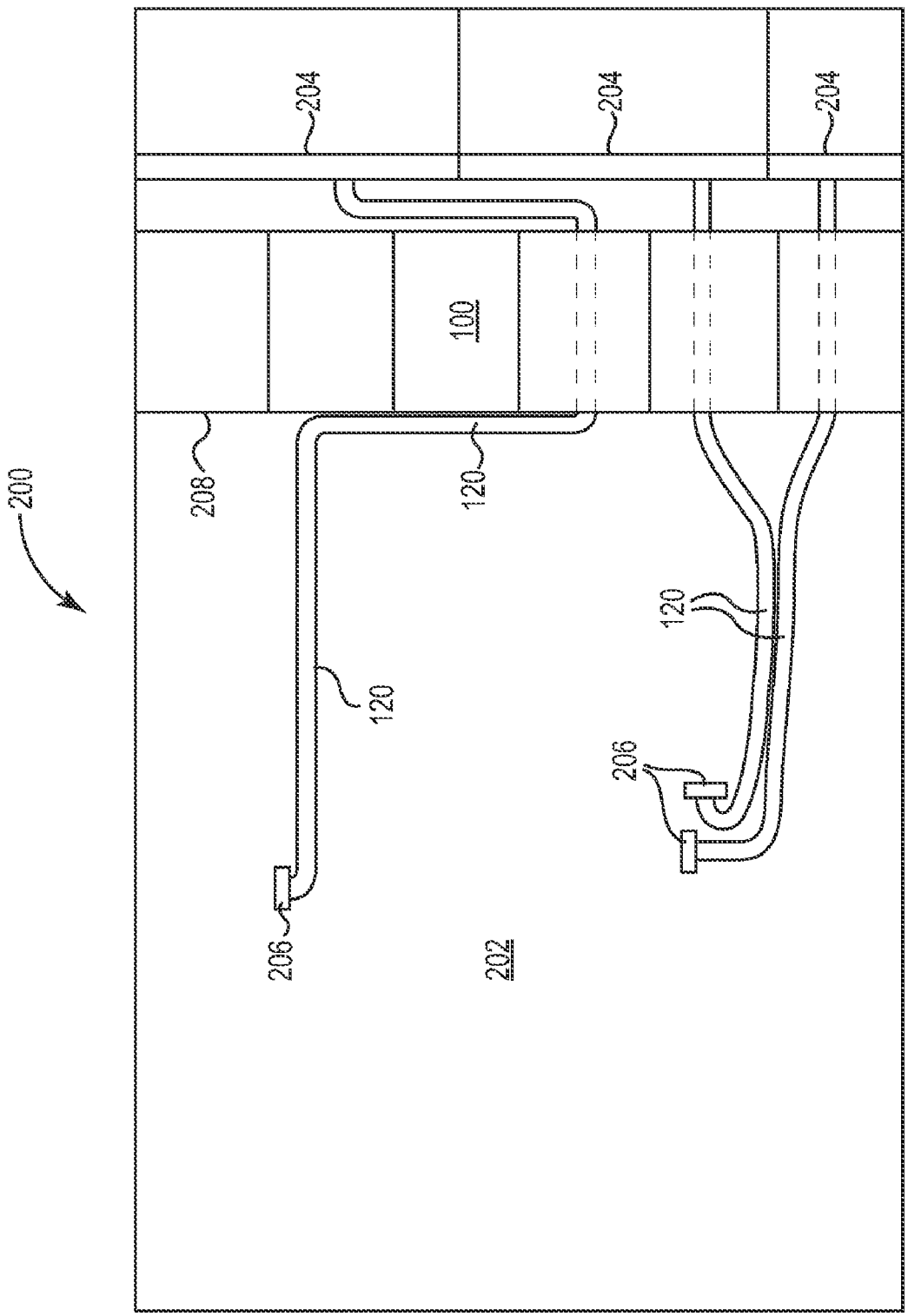
FIG. 4 is a sectional view of the fan holder in a computer system according to one embodiment.

FIG. 4 illustrates one embodiment of a computer system 200 including a main system board 202 and at least one sub-system board 204. In one embodiment computer system 200 is a rack server, such a compact rack server. In one example embodiment, computer system is a compact 2U rack server and sub-system boards 204 include a SAS backplane board, a DVD drive board, and an SID board. In one embodiment, sub-system boards 204 are installed at a front bezel of computer system 200. Sub-system boards 204 are electrically connected to connectors 206 of main system board 202 with cables 120. Cables 120 are routed from the at least one sub-system board 204 to connectors 206 of main system board 202 through base 108 of fan holder 100.

Figure 5:
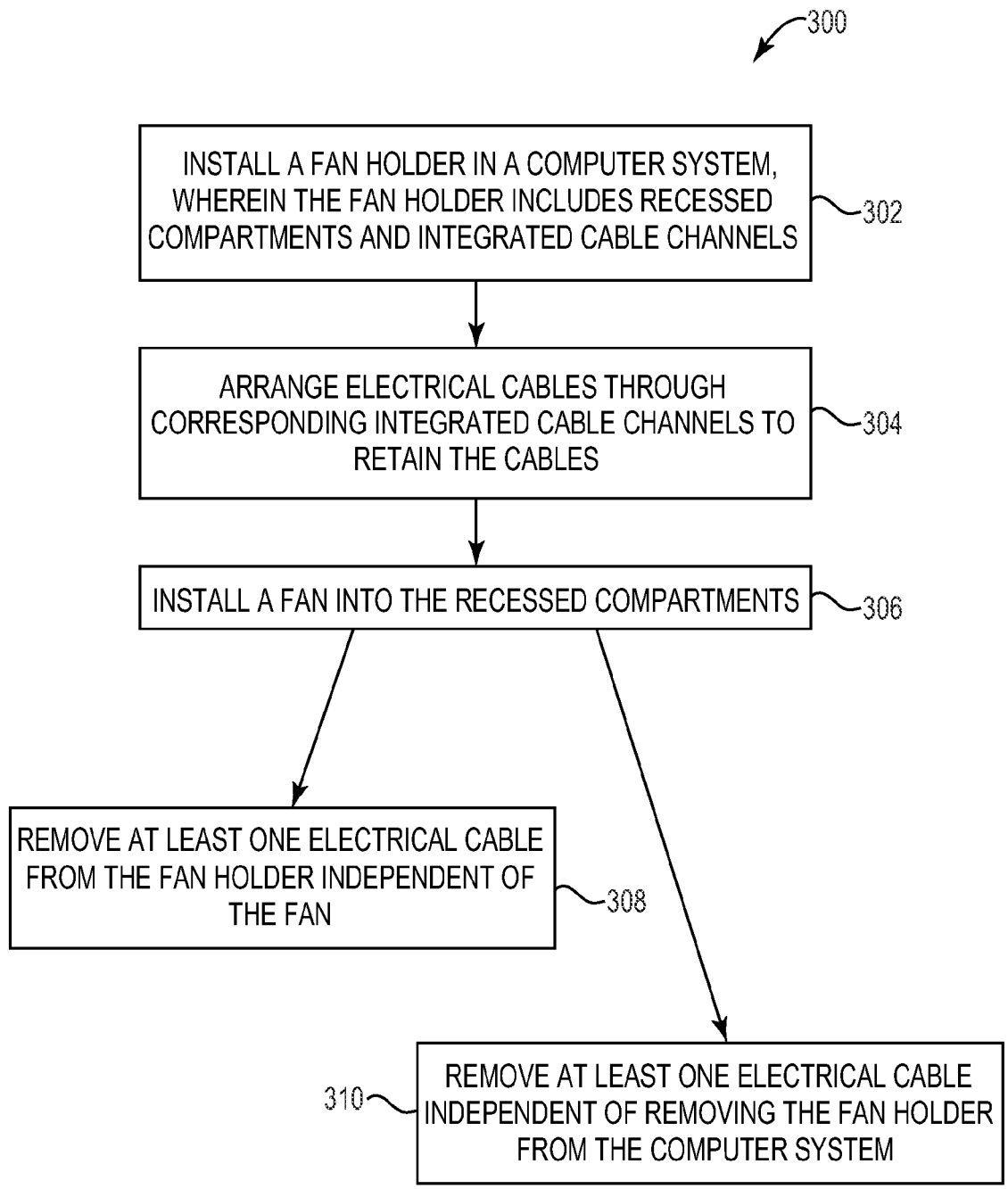
FIG. 5 is a flow diagram illustrating one embodiment of method of removably retaining electrical cables in a computer system.

FIG. 5 illustrates one embodiment of a method 300 of removably retaining electrical cables (e.g. cables 120) in a computer system (e.g. computer system 200). At 302, a fan holder (e.g. fan holder 100) is installed in the computer system. The fan holder includes at least one recessed compartment (e.g. fan compartment 110) and at least one integrated cable channel (e.g. cable channel 112) configured to retain the cables. At 304, at least one electrical cable is arranged through the corresponding integrated cable channel. At 306, a fan (e.g. fan 130) is installed into each of the recessed compartments.

In one embodiment, at 308, at least one electrical cable is removed from the fan holder independent of the fan. In one embodiment, at 310, at least one electrical cable is removed independent of removing the fan holder from the computer system. In one embodiment, the computer system employed in method 300 is a rack server.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A fan holder, comprising:
 a casing structure including:
  a first end wall and an opposing second end wall;

a first side and a second side opposite the first side extending from the first end wall to the second end wall;

a plurality of fan compartments formed in a series as a single unit between the first and second sides and between the first and second end walls;

a base extending vertically from the plurality of fan compartments between the first and second sides and between the first and second end walls, the base including fan connector openings; and a plurality of cable channels extending from the first side to the second side within a vertical space of the base, wherein each of the cable channels is configured to removably secure at least one of a plurality of cables.

2. The fan holder of claim 1, wherein the cable channel comprises cantilevered arms.

3. The fan holder of claim 2, wherein the cantilevered arms each include a hooked end.

4. The fan holder of claim 2, wherein the cantilevered arms are rigidly flexible.

5. The fan holder of claim 1 further comprising:
an attachment mechanism configured to securely mount the fan holder within a computer system.

6. The fan holder of claim 1, wherein the casing structure comprises plastic resin.

7. The fan holder of claim 1, wherein the casing structure is formed monolithically.

8. The fan holder of claim 1, wherein the plurality of fan compartments are aligned in a series along the base.

9. The fan holder of claim 1, wherein the base at each of the plurality of cable channels is a greater height than a remainder of the base.

10. The fan holder of claim 1 further comprising:
a fan compartment wall extending between each of the plurality of fan compartments.

11. A computer system comprising:
a main system board;
at least one sub-system board;
at least one electrical cable configured to electrically couple the main system board to the at least one sub-system board;
a fan holder disposed between the main system board and at least one sub-system board, the fan holder comprising:
at least one fan compartment configured to house a fan;
a base extending vertically from the at least one fan compartment, the base including a first side and an opposing second side extending parallel to the main system board, and at least one fan connector opening; and
at least one cable channel configured to removably retain the at least one electrical cable within a vertical space of the base, wherein the at least one electrical cable channel adjoins the at least one fan compartment at the base; and
at least one fan disposed in the at least one fan compartment.

12. The computer system of claim 11, wherein the computer system is a rack server.

13. The computer system of claim 11, wherein the at least one fan is removably installed through a first side of each of the fan compartments.

14. The computer system of claim 11, wherein the at least one fan includes an extended fan connector configured to selectively mate with a fan board connector.

15. The computer system of claim 11, wherein the cable channel includes at least one cantilevered arm.

16. The computer system of claim 15, wherein the at least one cantilevered arm is flexible.

17. A method of removably retaining electrical cables in a computer system, comprising:
installing a fan holder in the computer system, wherein the fan holder includes at least one recessed compartment and a base having a vertical space including at least one integrated cable channel configured to retain cables, wherein the at least one recessed compartment is proximal to a cover of the computer system and the base with the at least one integrated cable channel is distal to the cover;
arranging at least one electrical cable through the at least one integrated cable channel; and
installing a fan into each of the at least one recessed compartment.

18. The method of claim 17 further comprising:
removing the at least one electrical cable from the fan holder independent of the fan.

19. The method of claim 17 further comprising:
removing the at least one electrical cable independent of removing the fan holder from the computer system.

20. The method of claim 17, wherein the computer system is a rack server.

* * * * *